US008465589B1

(12) United States Patent
Nath et al.

(10) Patent No.: US 8,465,589 B1
(45) Date of Patent: Jun. 18, 2013

(54) MACHINE AND PROCESS FOR SEQUENTIAL MULTI-SUBLAYER DEPOSITION OF COPPER INDIUM GALLIUM DISELENIDE COMPOUND SEMICONDUCTORS

(75) Inventors: Prem Nath, Fort Lauderdale, FL (US); Venugopala R. Basava, Highlands Ranch, CO (US); Ajay Kumar Kalla, Centennial, CO (US); Peter Alex Shevchuk, Arvada, CO (US); Mohan S. Misra, Golden, CO (US)

(73) Assignee: Ascent Solar Technologies, Inc., Thornton, CO (US)

( * ) Notice: Subject to any disclaimer, the term of this patent is extended or adjusted under 35 U.S.C. 154(b) by 0 days.

(21) Appl. No.: 12/701,449

(22) Filed: Feb. 5, 2010

Related U.S. Application Data

(60) Provisional application No. 61/150,282, filed on Feb. 5, 2009.

(51) Int. Cl.
*C23C 16/00* (2006.01)
(52) U.S. Cl.
USPC ............ 118/715; 118/718; 118/719; 257/77; 257/431; 257/433; 257/E21.528
(58) Field of Classification Search
None
See application file for complete search history.

(56) References Cited

U.S. PATENT DOCUMENTS

| 6,048,442 | A | 4/2000 | Kushiya et al. |
| 6,323,417 | B1 | 11/2001 | Gillespie et al. |
| 6,372,538 | B1 | 4/2002 | Wendt et al. |
| 6,974,976 | B2 | 12/2005 | Hollars |
| 7,194,197 | B1 | 3/2007 | Wendt et al. |
| 7,374,963 | B2 | 5/2008 | Basol |
| 7,544,884 | B2 | 6/2009 | Hollars |
| 7,560,641 | B2 | 7/2009 | Menezes |
| 7,576,017 | B2 | 8/2009 | Tuttle |
| 8,021,905 | B1 | 9/2011 | Nath et al. |
| 2006/0096635 | A1 | 5/2006 | Tuttle |
| 2006/0207644 | A1 | 9/2006 | Robinson et al. |
| 2006/0219547 | A1 | 10/2006 | Tuttle |
| 2007/0093006 | A1 | 4/2007 | Basol |
| 2007/0227633 | A1 * | 10/2007 | Basol ........................... 148/518 |
| 2007/0253686 | A1 | 11/2007 | Wendt et al. |
| 2008/0093221 | A1 | 4/2008 | Basol |
| 2008/0095938 | A1 | 4/2008 | Basol |
| 2008/0175993 | A1 | 7/2008 | Ashjaee et al. |

(Continued)

OTHER PUBLICATIONS

Appeal Brief filed in related U.S. Appl. No. 12/771,590, filed May 16, 2011, 19 pages.

(Continued)

*Primary Examiner* — Evan Pert
*Assistant Examiner* — Mark A Laurenzi
(74) *Attorney, Agent, or Firm* — Lathrop & Gage LLP

(57) ABSTRACT

A method of manufacture of CIGS photovoltaic cells and modules involves sequential deposition of copper indium gallium diselenide compounds in multiple thin sublayers to form a composite CIGS absorber layer of a desirable thickness greater than the thickness of each sublayer. In an embodiment, the method is adapted to roll-to-roll processing of CIGS PV cells. In an embodiment, the method is adapted to preparation of a CIGS absorber layer having graded composition through the layer. In a particular embodiment, the graded composition is enriched in copper at a base of the layer. In an embodiment, each CIGS sublayer is deposited by co-evaporation of copper, indium, gallium, and selenium which react in-situ to form CIGS.

8 Claims, 5 Drawing Sheets

U.S. PATENT DOCUMENTS

| | | |
|---|---|---|
| 2008/0226270 A1 | 9/2008 | Wendt et al. |
| 2008/0247737 A1 | 10/2008 | Wendt et al. |
| 2008/0247738 A1 | 10/2008 | Wendt et al. |
| 2008/0254202 A1 | 10/2008 | Stolt et al. |
| 2008/0280030 A1 | 11/2008 | Van Duren et al. |
| 2008/0302418 A1 | 12/2008 | Buller et al. |
| 2009/0020149 A1 | 1/2009 | Woods et al. |
| 2009/0117684 A1 | 5/2009 | Basol |
| 2009/0199895 A1 | 8/2009 | Basol |
| 2009/0223551 A1 | 9/2009 | Reddy et al. |
| 2009/0226717 A1 | 9/2009 | Basol |
| 2009/0250722 A1 | 10/2009 | Bruce et al. |
| 2009/0255467 A1 | 10/2009 | Britt et al. |
| 2009/0255469 A1 | 10/2009 | Britt et al. |
| 2009/0258444 A1 | 10/2009 | Britt et al. |
| 2009/0258476 A1 | 10/2009 | Britt et al. |
| 2010/0087016 A1 | 4/2010 | Britt et al. |
| 2010/0133093 A1 | 6/2010 | Mackie et al. |
| 2010/0173440 A1 | 7/2010 | Birkmire et al. |

OTHER PUBLICATIONS

U.S. Appl. No. 12/771,590, Notice of Allowance mailed Jul. 7, 2011, 9 pages.

U.S. Appl. No. 12/771,590, Office Action mailed Dec. 15, 2010, 10 pages.

U.S. Appl. No. 12/771,590, Response to Office Action filed Nov. 19, 2010, 6 pages.

U.S. Appl. No. 12/771,590, Office Action and Examiner Interview Summary mailed Oct. 19, 2010, 11 pages.

U.S. Appl. No. 12/771,590, Response to Office Action filed Sep. 9, 2010, 4 pages.

U.S. Appl. No. 12/771,590, Office Action mailed Sep. 3, 2010, 13 pages.

* cited by examiner

MACHINE AND PROCESS FOR SEQUENTIAL MULTI-SUBLAYER DEPOSITION OF COPPER INDIUM GALLIUM DISELENIDE COMPOUND SEMICONDUCTORS

CROSS-REFERENCE TO RELATED APPLICATIONS

This application claims benefit of priority to U.S. Provisional Patent Application Ser. No. 61/150,282, filed Feb. 5, 2009, which is incorporated herein by reference.

BACKGROUND

A popular thin-film photovoltaic technology is called CIGS, which refers to a p-type semiconductor photon-absorber layer containing at least Copper, Indium, Gallium, and Selenium having the ability to absorb solar radiation and generate electron-hole pairs. In a typical CIGS photovoltaic cell, a Copper-Indium-Gallium-diSelenide layer operates with a heterojunction partner layer to generate a photocurrent when exposed to light. Additional layers, such as a substrate, top and bottom contact layers, passivation layers, and metallization, may be present in the cell for structural rigidity, to collect the photocurrent, and protect the cell.

CIGS semiconductor thin film can be created by a variety of processes, both in vacuo and ex vacuo in nature. Deposition methods such as sputtering, co-evaporation, and combinations of sputtering and evaporation performed in vacuo have produced CIGS photon absorber layers with high demonstrated performance, but traditional means for fabricating the CIGS film are perceived as slow and prone to defects. Both sputtering and evaporation may involve a reactive process to create the CIGS alloy film having desired stoichiometry. Slow fabrication speed can lead to high fabrication cost. Defects in a CIGS film can allow recombination of electron-hole pairs thereby reducing cell efficiency. Further, defects may short-circuit part or all of the photocurrent, impairing function of individual cells and monolithically integrated modules having CIGS cells. Other defects can provide a path, or via, to underlying conductive materials, thereby allowing subsequent depositions of electrically conductive material to generate an electrical short. Defects that cause short-circuiting are known herein as short-circuit defects. Defects therefore reduce manufacturing yield and increase fabrication cost.

Some methods of creating a CIGS absorber layer deposit CIGS directly. Other methods deposit precursor sublayers, such as layers of copper, layers of indium and gallium, and layers of selenium, that are reacted in-situ to form CIGS. Delivery of either CIGS or the sublayers can be performed by a single source, or by a plurality of sources. Existing processes require that the cell remain in a deposition zone for a lengthy time to deposit and form a CIGS layer of the desired thickness.

Many defects in CIGS layers initiate at the surface of the underlying contact layer when the elements are initially disposed on the surface; these defects originate at the bottom of the CIGS layer. Defects originating at the bottom of the layer may propagate through the entire layer. Growing CIGS films to the desired thickness without termination can allow these defects to propagate through the thickness of the film; defects extending through the thickness of the film are particularly prone to cause short-circuit defects because later deposited layers may contact layers underlying the CIGS layer.

Traditional in vacuo processing of semiconductor materials is batch-oriented. Substrates and source materials are placed in a chamber, air in the chamber is pumped out, deposition is performed, air is allowed back into the chamber after deposition is completed, and the substrates are moved to further processing stations. In order to reduce cost of photovoltaic cells by increasing the area of cell produced with each pumping cycle of the chamber, there is much interest in roll-to-roll processing. In roll-to-roll processing, substrate of a feed roll is unrolled within the chamber, passed through at least one deposition and reaction zone, and wound onto a take-up roll after passing through the deposition and reaction zone. In roll-to-roll processing, there is economic advantage in maintaining high substrate transport speed through the deposition zone. High substrate speed through a deposition zone while reaching a desired film thickness requires either an extended deposition zone length or a rapid deposition rate of the film.

Increasing deposition rates of the traditional in vacuo CIGS deposition process typically requires larger size or larger quantity of sources, or both, but the basic sequencing of deposition is typically unchanged and propagation of defects through the entire thickness of the CIGS layer may be enhanced at high deposition rates. Defects propagating through the entire thickness of CIGS that cause the short-circuit defects are particularly critical to large-area CIGS modules formed by monolithic integration. Unlike modules made with discrete cells that are sorted to match performance prior to module integration, a monolithically integrated module is processed from a contiguous section of photovoltaic material, and any defect contained therein can severely affect the performance of that module.

SUMMARY

Materials used in the fabrication of a CIGS photovoltaic device are disposed as thin films onto a substrate material that serves as a structural support for the assorted thin films.

The present approach for depositing CIGS involves the deposition of the four elements in such a way as to create a series of sequential CIGS sublayers, each of which is substantially identical in composition but of notably less than the desired total thickness. In an embodiment, the deposition of each sublayer is performed in vacuo, confined to an area referred to as a 'zone', using physical vapor deposition sources such as sputter and evaporation sources for each of the four elements in a deposition zone associated with deposition of the sublayer. Each deposition zone may also incorporate a reactive or annealing process to create CIGS alloy film having desired stoichiometry. Multiple deposition zones are provided, one deposition zone for each sublayer deposited.

This approach, as discovered, presents improvement over prior art in three ways.

First, this approach can accommodate virtually any existing process that creates a CIGS, and is particularly adaptable to roll-to-roll processing. In roll-to-roll processing, the substrate is unrolled from a feed spool, moves through the multiple deposition zones sequentially, and is wound onto a takeup spool. Each zone can be defined by the direct fabrication of the CIGS material, or as sublayers that are reacted to form the CIGS material.

Second, by requiring each of the deposition zones to create a substantially identical CIGS film with a notably lower thickness than the total desired, the transport speed of the substrate through each zone can be higher than if that zone were required to produce the entire CIGS film thickness. With multiple deposition zones, the transport speed of the web through the zones, resulting in CIGS film of the total desired thickness, is much greater than using a single-zone approach.

Third, by utilizing several of CIGS sublayers, the growth of each being terminated prior to reaching the total desired thickness, it is less likely that defects will propagate through the total thickness of the resultant CIGS layer, thereby presenting a final CIGS film with fewer short-circuit defects present.

This approach provides the ability to adjust the chemistry in individual CIGS sublayers in order to produce an overall CIGS absorber layer film with desirable properties. These properties may include gradients of the four elements through the total thickness of the CIGS absorber layer. These gradients can enhance the conversion efficiency of the photovoltaic device of which the CIGS absorber layer is a part.

DETAILED DESCRIPTION OF THE EMBODIMENTS

Figure 1:
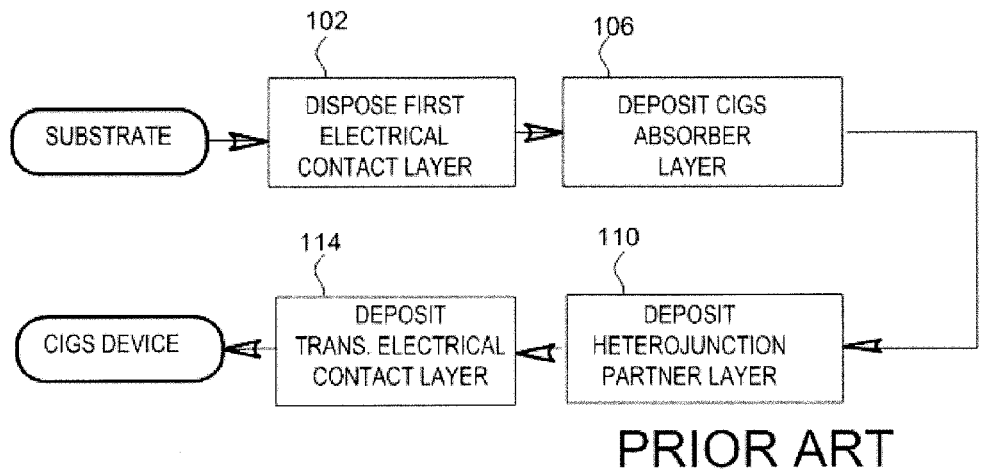
FIG. 1 is a flowchart of a generic fabrication for a thin-film photovoltaic (PV) device based on the CIGS absorber technology.
Figure 1A:
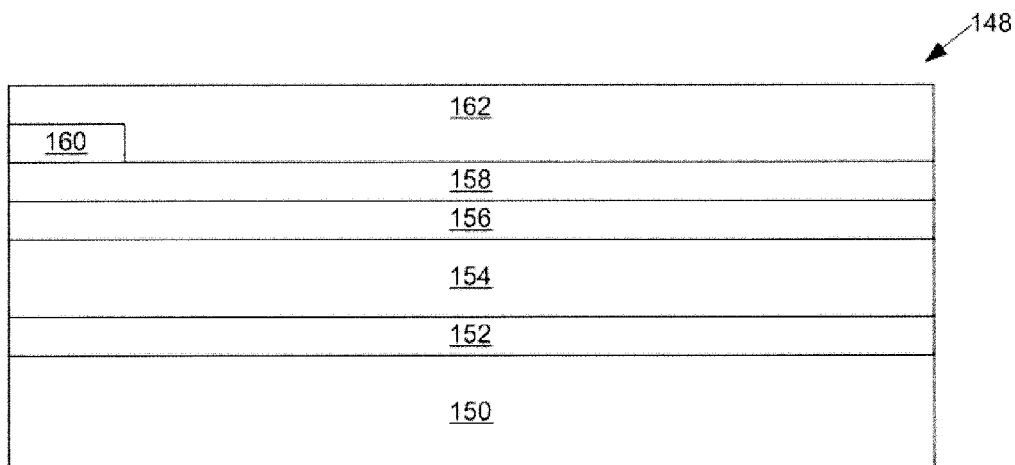
FIG. 1A is a cross section of a PV cell such as may be made by the process of FIG. 1.

FIG. 1 illustrates a generic fabrication process for a thin-film photovoltaic (PV) device based on the CIGS absorber technology, consisting of a sequence of individual process steps as known in the art. A substrate 150 (FIG. 1A) is used as the base for all subsequently-deposited thin films. Such a substrate may be rigid or flexible, may be an insulator or conductor, and may incorporate additional layers already deposited on it. An electrically-conductive or contact layer 152 is deposited in a deposition step 102 onto the substrate material 150 to serve as a back contact to the CIGS device. The contact layer 152 deposited in step 102 may incorporate metals, semiconductors, or conductive oxides. In one embodiment, the contact layer is molybdenum metal. A p-type compound semiconductor containing at least copper, indium, gallium, and selenium, often referred to in the industry as Copper-Indium-Gallium-DiSelenide (CIGS) 154, is deposited over the contact layer 152 in step 106. This process may include both nonvacuum and vacuum-based deposition technologies. Known vacuum-based processes for deposition 106 of CIGS include evaporation, plasma-assisted evaporation, sputtering, and reactive sputtering.

Once CIGS layer 154 is deposited, an n-type heterojunction partner layer 156 is deposited 110 onto the substrate/contact/CIGS stack. This process may be either nonvacuum or vacuum based, and may include Cadmium Selenide or other suitable oxide materials. The materials deposited must be suitable to form the desired electrical interface with the CIGS film. Next, a transparent conductive oxide contact layer 158 is deposited 114 onto the substrate/contact/CIGS/heterojunction partner stack. Again, this process may be either nonvacuum or vacuum based, and may include one or more films of transparent oxides, transparent conductive oxides, and transparent conductive polymers. The contact layer 158 is transparent to facilitate transmission of light to the CIGS layer in order to facilitate the desired photovoltaic energy conversion process.

Additional conductive layers such as a top metallization layer 160, and a passivation layer 162, or another photovoltaic cell, may be deposited over the contact layer 158, and patterning and interconnect steps may also be performed to provide a monolithically integrated device. The result of the process described in FIG. 1 is a photovoltaic device 148 based on the CIGS absorber layer 154.

The order of steps in the process of FIG. 1 could be varied, such as to form alternate photovoltaic device configurations as known in the art. For example, the process of FIG. 1 could be varied such that a transparent contact layer is formed on a transparent substrate, a heterojunction partner layer is formed on the transparent contact layer, a CIGS layer is formed on heterojunction partner layer, and another contact layer is formed on the CIGS layer.

Figure 2:
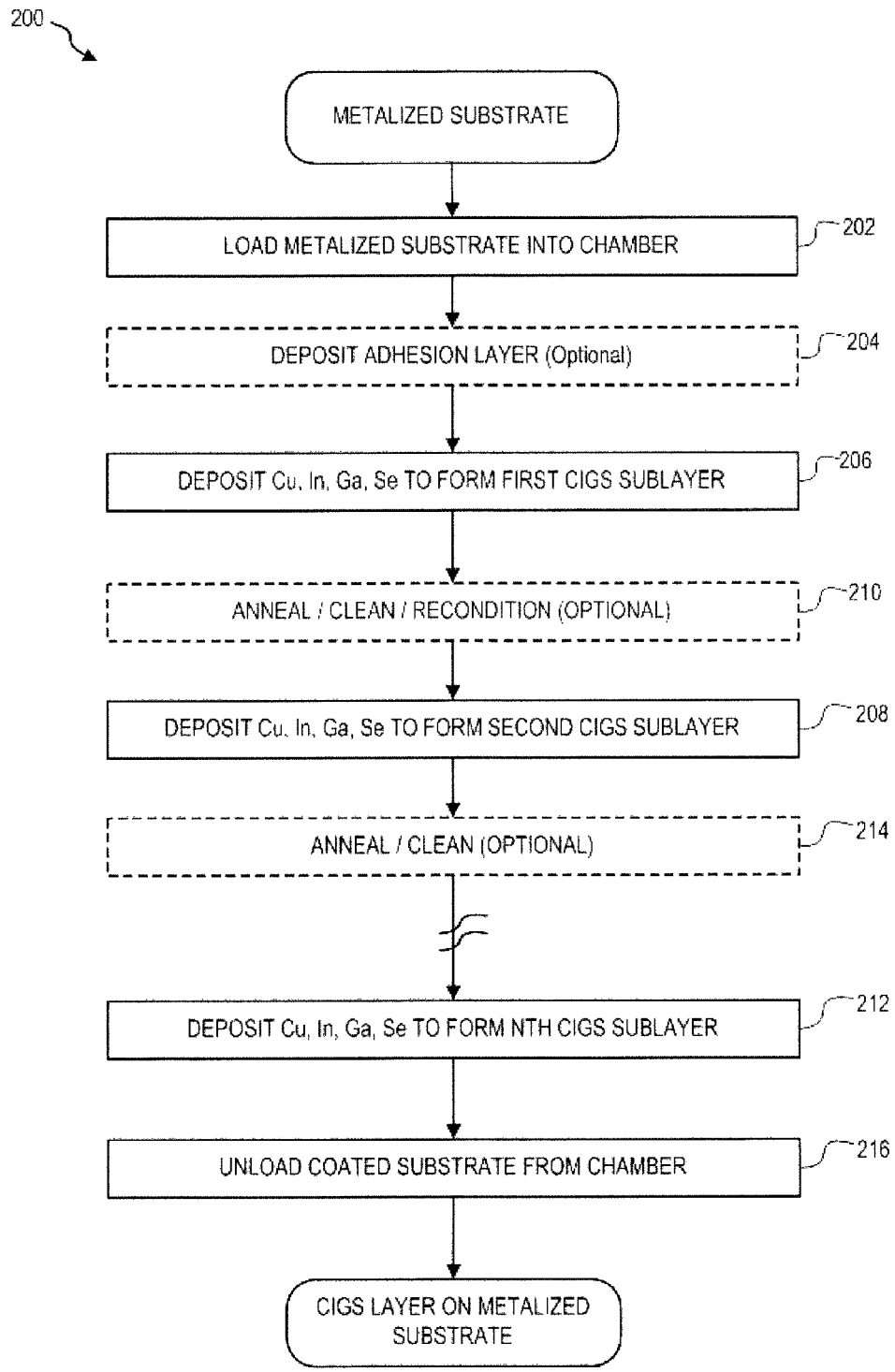
FIG. 2 is a flowchart of a process for creating CIGS layers by depositing multiple CIGS sublayers in contact with each other.
Figure 2A:
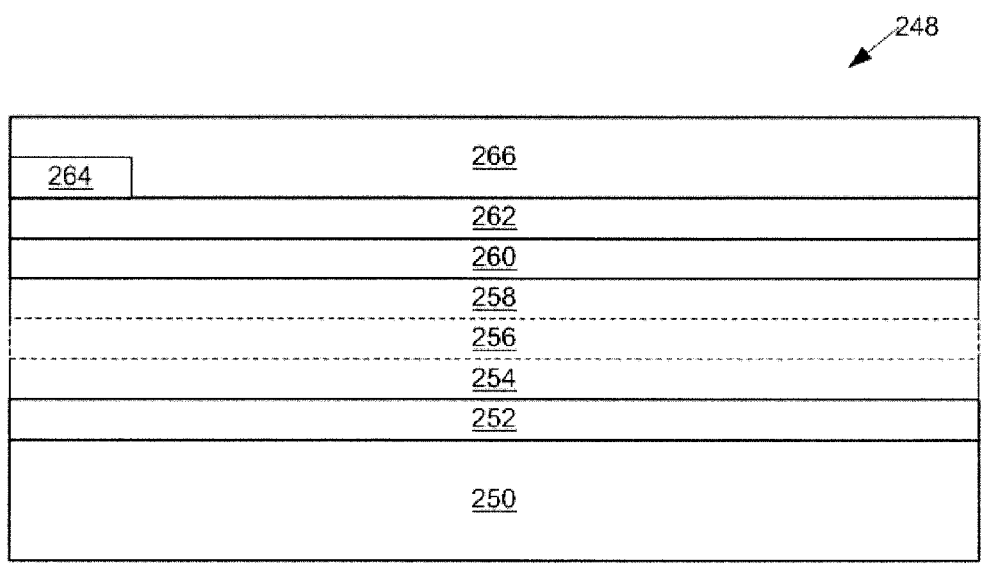
FIG. 2A is a cross section of a PV cell such as may be made by the improved process of FIG. 2.

FIG. 2 represents a process 200 for depositing a CIGS absorber layer according to the present invention. FIG. 2A is a cross sectional diagram of a CIGS PV cell 248 made according to the process of FIG. 2. A substrate 250/contact metal 252 stack, or metalized substrate, is loaded 202 into a machine and exposed to a vacuum. The substrate 250/contact metal 252 stack is fed into an optional zone where an adhesion layer (not shown) may be deposited 204 on the substrate 250/contact metal 252 stack. The substrate 250/contact metal 252 stack is then fed into a first deposition zone where a first sublayer of CIGS 254 is deposited 206 on the substrate 250/contact metal 252 stack. The substrate 250/contact metal 252 stack is then fed into a second deposition zone where a second sublayer of CIGS 256 is formed 208 on the substrate 250/contact metal 252 stack. In an embodiment, an annealing and cleaning step 210 may be interposed between deposition 206 of the first sublayer of CIGS 254 and deposition 208 of the second sublayer of CIGS 256 to provide an optimum opportunity for the second sublayer 256 of CIGS to seed and fill defects in the first sublayer of CIGS 254. Each sublayer of CIGS forms part of an overall layer of CIGS throughout which are generated electron-hole pairs in response to photons of electromagnetic energy of sufficient energy incident thereon. In certain embodiments, each sublayer has a same composition. In other embodiments, the compositions of two or more sublayers differ such that the solar absorber layer has a composition that is graded in at least one elemental concentration from at least one sublayer to another sublayer. In some embodiments, each sublayer has a same thickness, while in other embodiments, at least two sublayers have different thicknesses.

Additional zones for deposition of additional sublayers of CIGS may be provided. In an embodiment, the substrate 250/contact metal 252 stack is next fed into a third deposition zone where a third sublayer of CIGS 258 is deposited 212 on the substrate 250/contact metal 252 stack. In an embodiment, an annealing and cleaning step 214 may be interposed between deposition 208 of the second sublayer of CIGS 256 and deposition 212 of the third sublayer of CIGS 258.

Additional zones, such as a fourth, fifth, etc. zone for deposition of additional sublayers of CIGS may also be provided in some embodiments. In certain embodiments, each deposited CIGS sublayer, if of sufficient thickness, would itself be suitable for use as a p-type semiconductor solar absorber layer in a photovoltaic cell without requiring any additional processing of the solar absorber sublayer. For example, in some embodiments, each deposited CIGS sublayer is individually reacted (e.g., subjected to an energy source such as heat and/or subjected to one or more materials) to complete formation of the sublayer prior to depositing the next CIGS sublayer such that each CIGS sublayer is a p-type semiconductor solar absorber sublayer capable of generating electron-hole pairs in response to photons of electromagnetic energy of sufficient energy incident thereon. In the context of this disclosure and claims, individually reacted means each solar absorber sublayer is reacted independently, or substantially independently, from each other solar absorber sublayer. In alternate embodiments, each deposited sublayer is formed of a Copper-Indium-DiSelenide (CIS) material or an alloy of a CIS material other than CIGS.

Once a sufficient total thickness of CIGS has been deposited, the resulting substrate 250/contact metal 252/CIGS 254 256 258 stack is passed to further zones for additional processing, or unloaded 216 from the machine for continued processing steps 110 and 114. For example, once a sufficient total thickness of CIGS has been deposited, heterojunction partner layer 260, contact layer 262, top metallization layer 264, and passivation layer 266 are deposited.

Figure 3A:
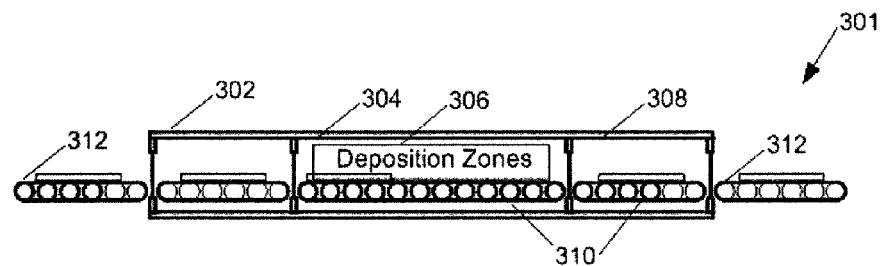
FIG. 3A is a diagram of a machine for carrying out the process of FIG. 2 on individual substrates.

FIG. 3A represents an embodiment of a machine for performing the process of FIG. 2. Machine 301 represents an inline approach for depositing CIGS suitable for either metalized rigid or flexible substrate. The vacuum system has three separate areas, an entry loadlock 302, a process chamber 304 that houses the at least two deposition zones 306, and an exit loadlock 308. In order to preserve vacuum in the process chamber 304, a series of valves are placed in between the entrance loadlock 302 and process chamber 304, and the process chamber 304 and the exit loadlock 308, respectively. Systematic operation of the valves allow the material to enter the vacuum process chamber 304, have CIGS deposited onto it in a plurality of sublayers (e.g., 254, 256, 258 of FIG. 2A), and exit the chamber via the exit loadlock 308 without losing vacuum. The transportation of substrate through the system is facilitated by a series of transport mechanisms 310. Additional handling apparatus 312 may be provided to feed substrates into the system and to stack substrates exiting the system.

Figure 3B:
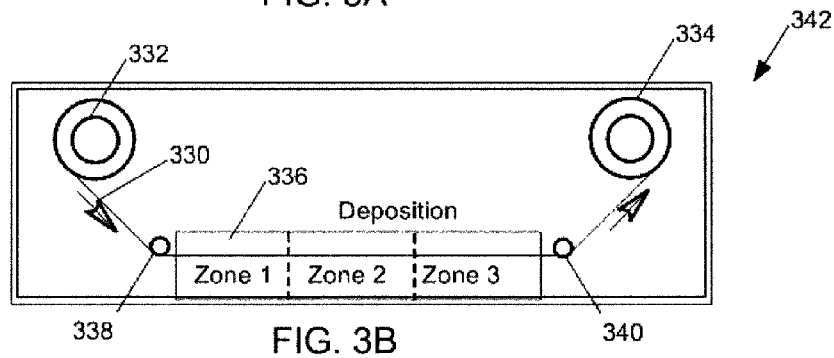
FIG. 3B is a diagram of a machine for carrying out the process of FIG. 2 on a continuous roll-to-roll substrate.

FIG. 3B illustrates another embodiment of a machine for performing the process of FIG. 2. Machine 342 represents a roll-to-roll approach, where the substrate 330 is necessarily flexible and is transported in a continuous web from a feed spool 332 to a take-up spool 334 through the multiple deposition zones 336. In this machine, a substrate 330 coated with the first metallic contact is placed in feed spool 332, and the substrate/contact is transported around a series of rollers 338 and 340 through the deposition zones 336. CIGS is deposited in multiple sublayers (e.g., 254, 256, 258 of FIG. 2A) to the desired total thickness, and the substrate/contact/CIGS assembly then exits and is rolled up on a take-up spool 334. This embodiment typically takes place with the entire CIGS deposition process occurring in vacuum, and typically in the same chamber.

Figure 3C:
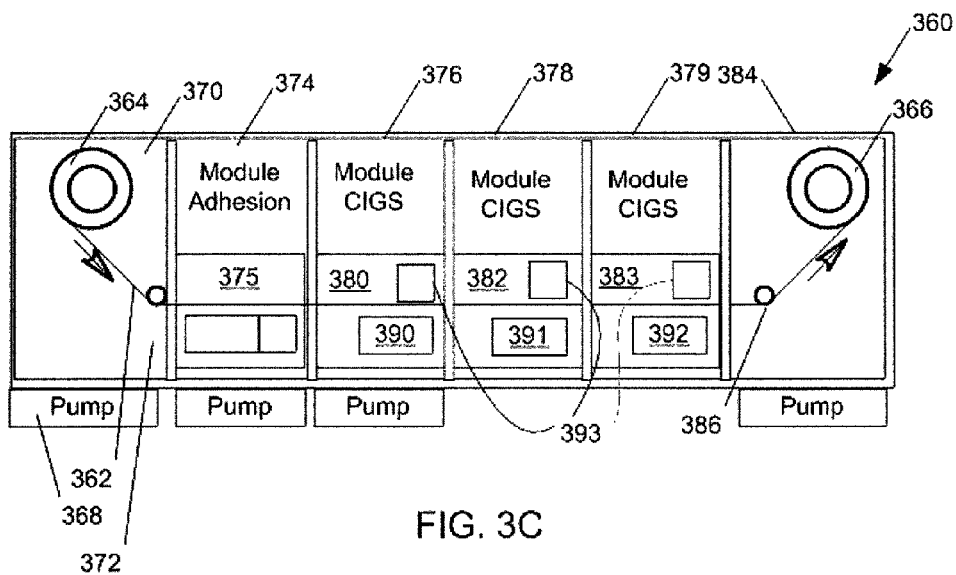
FIG. 3C is a diagram of a segmented machine for carrying out the process of FIG. 2 on a continuous, flexible, roll-to-roll, substrate.

Another embodiment of a machine 360 for performing the process of FIG. 2 is illustrated in FIG. 3C. This machine 360 is constructed from several independent specialized segments having couplers such that they may be coupled together in series in various combinations and with varied numbers of deposition zones. Each segment has a portion of housing that, when the segments are coupled together, forms part of the wall of the vacuum chamber of the machine. Airlock doors may optionally be provided at couplers of the segments such that substrate 362 may be loaded onto a feed spool 364, or coated substrate may be removed from a take-up spool 366, without admitting air to the entire machine 360. At least one, and optionally multiple, segments are equipped with vacuum pumps 368 to create and maintain vacuum in the machine 360.

A first segment 370 of the machine 360 contains the feed spool 364, and associated rollers 372, which transport a metalized substrate 362 along a substrate path through machine 360. An optional loading apparatus (not shown) may be provided for loading substrate 362 into the substrate path. In an embodiment, metalized substrate 362 on feed spool 364 is a flexible substrate 250 with a metal contact layer 252 already deposited upon it.

A second, optional, segment 374 of the machine may deposit an adhesion layer (not shown) in an adhesion layer deposition zone 375. Metalized substrate 362 then enters the first 376 of several CIGS deposition segments 376, 378, 379. Each CIGS deposition segment 376, 378, 379 has one or more CIGS deposition zones 380, 382, 383. Each deposition zone 380, 382, 383 has source devices 390, 391, 392 for providing vapor and/or ions of each of the four elements required to form CIGS—Copper, Indium, Gallium, and Selenium. The source devices are arranged such that the vapor and/or ions of the four elements deposit upon a surface of the substrate as a compound of these four elements. In an embodiment, each deposition zone 380, 382, 383 also has an energy source, such as an annealing heater 393 to control deposition and complete reacting the deposited material to form a CIGS sublayer; the first zone 380 forming a first CIGS sublayer 254, the second zone 382 forming a second CIGS sublayer 256, and the third zone 383 forming a third CIGS sublayer 258.

At an output end of the machine 360, an output segment 384 contains the take-up spool 366, and associated rollers 386 and apparatus as required for threading the substrate 362 through the substrate path and onto the take-up spool 366.

In alternative embodiments, additional segments having additional deposition zones may be provided between the third zone 383 and the output segment 384.

Figure 4:
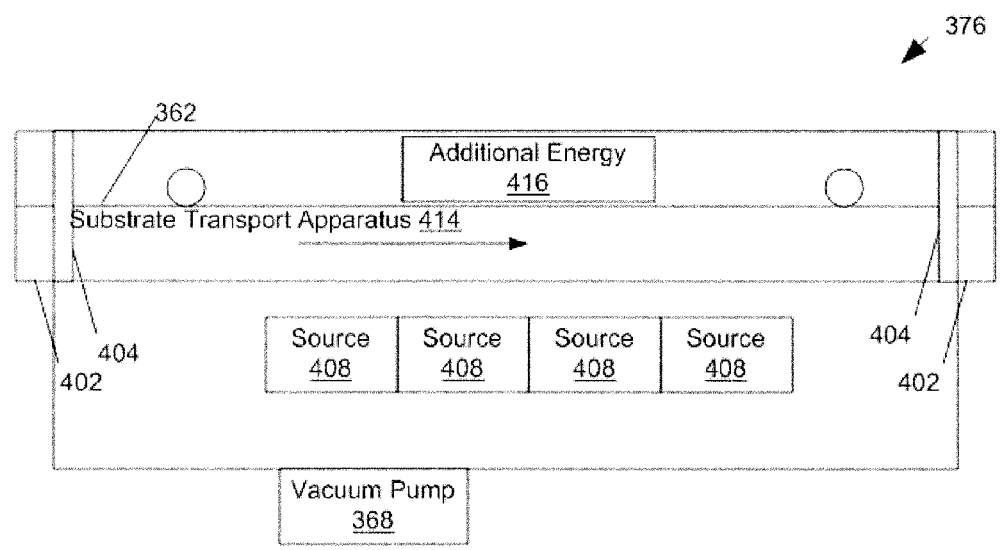
FIG. 4 is a diagram of an individual segment of the machine of FIG. 3C, or of an individual deposition zone of the deposition unit of FIG. 3B.

FIG. 4 illustrates a CIGS deposition segment 376, 378, 379 such as may be a component of machine 360. At each end of this segment 376, are couplers 402 that permit attachment of multiple segments 376 in series as shown in FIG. 3C. Baffles may optionally be provided as well such that undeposited vapor from segments of one type, such as adhesion layer deposition segment 374, does not unduly contaminate layers deposited by segments of another type, such as CIGS deposition segment 376. Doors 404 may optionally be provided at segment ends to permit loading or unloading of substrate into the first segment or the output segment without opening the entire machine to air. Within the segment 376 are one or more vapor source units 408 for each of copper, selenium, indium, and gallium; each vapor source may operate through heating of an appropriate material or through sputtering of an appropriate material. Vapor from the source units collects and reacts to form a deposit on substrate 362 suspended near source units 408 by substrate transport apparatus 414.

In an embodiment, one or more sources of additional energy 416 source, such as a plasma energy source, an optical energy source, or a electric heat source, are provided for applying additional energy to the substrate as evaporated material condenses upon it; this helps influence deposit composition and grain formation and facilitates formation of the CIGS alloy. In an embodiment, heaters 416 apply heat to a reverse side of the substrate 362. In an alternative embodiment, a further plasma cleaning device may be included in a zone to recondition the underlying surface of contact metallization 252 at defects in the first CIGS sublayer 254 and allow improved sealing of these defects by new grain formation at these defects of subsequent deposited CIGS sublayers 256, 258.

Each segment may contain more than one deposition zone, where each zone has vapor source units 408 for each of selenium, copper, indium, and gallium, and an electric heater 416. The source units 408, substrate transport apparatus 414, and the additional energy 416 sources may be located in various locations within the machine to optimize material quality, substrate transport efficiency.

In an alternative embodiment, since selenium vapor spreads rapidly through the segment, a segment has a single vapor source unit 408 for selenium, and two deposition zones each having vapor source units 408 for each of copper, indium, and gallium with an alloying heater 416.

Each CIGS deposition zone within the deposition zones 306, 336 of the machines of FIGS. 3A and 3B also has at least one source for each of copper, indium, gallium, and selenium as illustrated in FIG. 4 in order to carry out the process of FIG. 2.

In an alternative embodiment, apparatus as heretofore discussed provides a CIS alloy instead of CIGS by omitting gallium sources.

In an embodiment of the machine of FIG. 3C, a first CIGS deposition segment 376 deposits a first sublayer 254 of CIGS that is somewhat enriched in copper, while later CIGS deposition segments 378 deposit a CIGS sublayer 256 unenriched in copper, and a subsequent CIGS deposition segment 379 may deposit a CIGS sublayer 258 slightly depleted in copper. The relative enrichment or depletion in copper is no more than a few percent—the sublayers 254, 256, 258 produced have substantially similar composition. This embodiment provides capability of producing a copper concentration that is graded across the total CIGS layer thickness as has been previously shown to enhance operating efficiency of CIGS photovoltaic cells.

In an embodiment of the machine of FIG. 3C, layer deposition segment 374 deposits 204 (FIG. 2) a very thin layer onto the metalized substrate containing primarily indium, gallium, and selenium that serves as an adhesion-enhancing layer, and can be used to provide preferential grain growth in the next-deposited sublayer 254 of CIGS film deposited in the subsequent step 206 carried out by segment 376.

The machine of FIG. 3C may contain two, three, four, or more CIGS segments 376, 378, 379 and can therefore deposit from 2 to N sublayers deposited in N process steps, where N is an integer, with the resulting films combining to create the desired total thickness of CIGS film. All of the CIGS sublayers disposed in CIGS segments 376, 378, 379 are predominantly CIGS in composition, and may or may not have different thicknesses.

Although embodiments described above include moving a substrate through a number of deposition zones (e.g., moving the substrate in steps or moving the substrate continuously), one of ordinary skill will appreciate after reading and comprehending the present application, that the embodiments described herein are not limited to only this configuration.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

The invention claimed is:

1. A system for forming a solar absorber layer of a thin-film photovoltaic cell, the system comprising at least a first and second individual deposition zone, each of the first and second individual deposition zones including
   a source device configured to deposit a material selected from the group consisting of Copper Indium DiSelenide and an alloy of Copper Indium DiSelenide; and
   a reacting subsystem configured to individually react the deposited material to form a p-type semiconductor solar absorber sublayer capable of generating electron-hole pairs in response to photons of electromagnetic energy incident thereon.

2. The system of claim 1, the system further comprising:
   a vacuum pump; and
   wherein the deposited material is an alloy of Copper Indium DiSelenide further including Gallium; and
   wherein each deposition zone comprises further includes a heater and sources for copper, indium, and gallium vapors.

3. The system of claim 2 further comprising a feed spool, a takeup spool, and substrate handling apparatus for passing a flexible substrate from the feed spool, through each of the first and second individual deposition zones, and onto the takeup spool.

4. The system of claim 1, each solar absorber sublayer having a same composition.

5. The system of claim 1, a first solar absorber sublayer having a first composition, a second solar absorber sublayer having a second composition, the first composition differing from the second composition, whereby the solar absorber layer has a composition that is graded in at least one element concentration from the first solar absorber sublayer to the second solar absorber sublayer.

6. The system of claim 5, a third solar absorber sublayer having a third composition, the third composition differing from the first and second compositions, whereby the solar absorber layer has a composition that is graded in at least one element concentration from the first solar absorber sublayer to the second solar absorber sublayer to the third solar absorber sublayer.

7. The system of claim 1, each solar absorber sublayer having a same thickness.

8. The system of claim 1, at least two solar absorber sublayers having a different thicknesses.

* * * * *

UNITED STATES PATENT AND TRADEMARK OFFICE
CERTIFICATE OF CORRECTION

PATENT NO.       : 8,465,589 B1
APPLICATION NO.  : 12/701449
DATED            : June 18, 2013
INVENTOR(S)      : Nath et al.

It is certified that error appears in the above-identified patent and that said Letters Patent is hereby corrected as shown below:

In the Specification
Column 6, Line 60, "or a" should read --or an--;

In the Claims
Claim 2, Column 8, Line 28, "zone comprises further," should read --zone further--.

Signed and Sealed this
Seventeenth Day of June, 2014

Michelle K. Lee
*Deputy Director of the United States Patent and Trademark Office*